(12) United States Patent
Pilz et al.

(10) Patent No.: US 7,696,489 B2
(45) Date of Patent: Apr. 13, 2010

(54) EMITTER FOR AN ION SOURCE AND METHOD OF PRODUCING SAME

(75) Inventors: Wolfgang Pilz, Dresden (DE); Lothar Bischoff, Dresden (DE)

(73) Assignee: ICT Integrated Circuit Testing Gesellschaft für Halbleiterprüftechnik mbH, Heimstetten (DE)

(*) Notice: Subject to any disclaimer, the term of this patent is extended or adjusted under 35 U.S.C. 154(b) by 354 days.

(21) Appl. No.: 11/494,274

(22) Filed: Jul. 27, 2006

(65) Prior Publication Data

US 2007/0034399 A1 Feb. 15, 2007

(30) Foreign Application Priority Data

Jul. 27, 2005 (EP) .................................. 05016351

(51) Int. Cl.
*H01J 27/00* (2006.01)
*H01T 23/00* (2006.01)
*H01J 37/08* (2006.01)
*H01J 27/26* (2006.01)

(52) U.S. Cl. ............................ 250/423 R; 250/423 F; 250/424; 250/425

(58) Field of Classification Search ............. 250/423 R, 250/423 F, 424, 425; 313/163; 315/111.01, 315/111.81
See application file for complete search history.

(56) References Cited

U.S. PATENT DOCUMENTS

| | | | | |
|---|---|---|---|---|
| 4,088,919 A * | 5/1978 | Clampitt et al. | ........... | 250/423 F |
| 4,318,029 A * | 3/1982 | Jergenson | ............... | 250/423 R |
| 4,721,878 A * | 1/1988 | Hagiwara et al. | ......... | 313/362.1 |
| 4,775,818 A | 10/1988 | Clark, Jr. et al. | | |
| 4,899,078 A * | 2/1990 | Winkler | ....................... | 313/37 |
| 5,399,865 A * | 3/1995 | Umemura et al. | ......... | 250/423 F |
| 5,936,251 A * | 8/1999 | Gierak et al. | ............ | 250/423 F |
| 6,337,540 B1 * | 1/2002 | Corbin et al. | .......... | 250/492.21 |
| 6,531,811 B1 * | 3/2003 | Kudo et al. | .............. | 313/362.1 |
| 7,129,513 B2 * | 10/2006 | Zhou et al. | .................... | 257/10 |
| 2003/0069522 A1 * | 4/2003 | Jacobsen et al. | ............ | 600/585 |
| 2003/0161970 A1 * | 8/2003 | Kaito | ......................... | 427/595 |
| 2006/0022143 A1 * | 2/2006 | Pilz et al. | ................ | 250/423 R |
| 2007/0034399 A1 | 2/2007 | Pilz et al. | | |

FOREIGN PATENT DOCUMENTS

| | | |
|---|---|---|
| JP | 58-046542 | 3/1983 |
| JP | 10-506497 | 1/1996 |
| JP | 2001052596 | 2/2001 |
| WO | WO-96/02065 A1 | 1/1996 |

OTHER PUBLICATIONS

Korean Office Action dated Aug. 3, 2007.

(Continued)

*Primary Examiner*—Jack I Berman
*Assistant Examiner*—Brooke Purinton
(74) *Attorney, Agent, or Firm*—Patterson & Sheridan, LLP

(57) ABSTRACT

An emitter for a liquid metal ion source is provided. The emitter includes a wire comprising a substantially curved portion and a surface wherein at least a portion of the wire surface is tapered at the substantially curved portion to form an emitter tip. Furthermore, a manufacturing method for such an emitter is provided.

24 Claims, 6 Drawing Sheets

OTHER PUBLICATIONS

Chao L C et al: "Rare earth focused ion beam implantation utilizing Er and Pr liquid alloy ion sources", Journal of Vacuum Science & Technology B: Microelectronics Processing and Phenomena, American Vacuum Society, New York, NY, US, vol. 17, No. 6, Nov. 1999, pp. 2791-2794, XP012007819, ISSN: 0734-211X, the whole document.

Cheng X Q et al: "Fabrication of PrSi2 layers and associated morphology on Si surface by a single-step high current Pr-ion implantation", Journal of Alloys and Compounds, Elsevier, Sequoia, Lausanne, CH, vol. 345, No. 1-2, 28 Oct. 2002, pp. 252-256, XP004388174, ISSN: 0925-8388.

Cooke M D et al: "Comparison of simple low-energy ion sources for direct deposition of submicron structures" Nanotechnology, IOP, Bristol, GB, vol. 14, No. 4, Apr. 1, 2003, pp. 416-422, XP020067529, ISSN: 0957-4484, section 2.2. Thermionic emmission, figure 5.

Machalett F et al: "Investigations on liquid alloy ion sources for rare-earth elements", Review of Scientific Instruments, American Institute of Physics, US, vol. 69, No. 3, Mar. 1998, pp. 1336-1339, XP012036455, ISSN: 0034-6748, Section II: Experiment.

Orloff J, Utlaut M, Swanson L: "High Resolution Focused Ion Beams: FIB and its application" Field Ionization Sources, Section 1.2 "Liquid Metal Field Ionization Sources", 2003, Kluwer Academic / Plenum Press, New York XP002434688, pp. 11-17, figure 1.6.

Wagner a et al: "Liquid gold ion source", Proceedings of the 15th Symposium on Electron, Ion, and Photon Beam Technology, May 29-Jun. 1, 1979, Boston, MA, USA, vol. 16, No. 6, Nov. 1979, pp. 1871-1874, XP002434426, Journal of Vacuum Science and Technology USA, ISSN: 0022-5355, section "Fabrication Procedure".

European Patent Office Communication regarding European Patent Application No. 05016351.8-2208 dated Jun. 18, 2007.

European Patent Office Communication regarding European Patent Application No. 05016351.8-2208 dated Mar. 26, 2008.

European Patent Office Communication regarding European Patent Application No. 05016351.8-2208 dated Feb. 25, 2009.

Chinese Office Action regarding Application No. 200610099530.1 dated Dec. 19, 2008.

Translation of the reasoning of Japanese Official Action.

* cited by examiner

PRIOR ART

EMITTER FOR AN ION SOURCE AND METHOD OF PRODUCING SAME

FIELD OF THE INVENTION

The invention relates to an emitter for an ion source and, particularly, an emitter for a liquid metal ion source (LMIS) or a liquid metal alloy ion source (LMAIS). The invention relates further to a method of producing such an emitter.

BACKGROUND OF THE INVENTION

Focused ion beam (FIB) technology is an important tool for the semiconductor industry. Focused ion beams are used for failure analysis, transmission electron microscopy specimen preparation, and circuit and mask modification. FIB micro and nanofabrication can be utilized to reduce the complexity required in conventional fabrication technology, in particular lithography, etching and implantation, which has to satisfy various requirements for different components fabricated on the same substrate.

The success of FIB technology is due to the invention of liquid metal ion sources (LMIS) and liquid metal alloy ion sources (LMAIS), respectively. In the following, reference to only LMIS or only LMAIS, respectively, should also be understood as a reference to the other type of ion source unless it is apparent that only either LMIS or LMAIS is meant. Three basic designs of LMIS exist, needle-type emitters, capillary-type emitters and porous emitters. For comparison, a photograph of a needle-type emitter and a capillary-type emitter is shown in FIG. 7.

In a needle-type emitter, a tiny hairpin (needle tip) and a filament, typically made of W, Ta, Ti or Ni, are used as an emitter (see left-hand side of FIG. 7). The emitter is wetted and loaded with the liquid metal source material to provide a liquid metal reservoir. For wetting of the source, the source material must be provided in liquid form. To this end, a resistance heater or an electron beam heater may be used. Then, the emitter is dipped into the heated liquid metal in high vacuum (about $10^7$ Torr). During operation, electric current is supplied to the filaments which are thus resistively heated. The heated liquid metal flows towards the needle-tip. High voltage is then applied between the needle tip and an extraction electrode. Due to the high electric field strength at the needle tip, an even smaller tip of liquid source material forms a so-called Taylor cone from which the ions are emitted. Thereby, a stable ion beam is generated from the source material. It is apparent that the tip end of the needle tip should form the hottest spot of the emitter so that liquid metal ions are produced essentially at the tip end.

In the following, the needle-type emitters will be explained in more detail in with reference to FIGS. 8A and 8B. FIGS. 8A and 8B are schematic views of a prior art needle-type liquid metal ion source. The emitter includes a needle tip 10, a filament 11 and supports 50. Typically, the supports 50 are mounted to a ceramic base and provide an electric terminal for filament 11. Filament 11 extends between the two supports and has an arc-like shape. At the apex of the arc, the needle tip 10 is attached to filament 11. As shown in FIG. 8B, needle tip 10 is attached to filament 11 by welding techniques, e.g. electrical spot-welding, so that weld spots 15 are formed. Therefore, the heating of needle tip 10 is only indirect in that the heat must be transferred from filament 11 to needle tip 10 via weld spots 15. As a result, it is not ensured that the tip end of the needle tip 10 is really the hottest part of the emitter. This may reduce the efficiency of the emitter. Furthermore, the reservoir portion of needle tip 10 may be excessively heated so that liquid metal material evaporates from the reservoir. Thus, the life time of the ion source is reduced and contamination of the specimen and the ion beam apparatus is increased.

A second type of LMIS is known as capillary-type or reservoir-type emitters. An example of such a capillary-type emitter is shown on the right-hand side of FIG. 7 and in FIG. 9. For the capillary design, the emitter module 10 consists of two metallic plates with a small source material reservoir 30. A sharp blade is accurately machined on one side of each plate. A thin layer of material is sputter-deposited on the other three sides of one of the plates, to act as a spacer; when the two emitter halves are tightly clamped together, a slit 17 of about 1 μm is left between the blades. Furthermore, a heater 40 is provided for heating the source material so that it is in a liquid state. The liquid source material flows through this tiny channel 17, forming a free surface at the exit of the slit 17 with a radius of curvature in the order of 1 μm. Under a strong electric field generated by the application of a voltage difference between the emitter and an extraction electrode located directly in front of it, the free surface of the liquid metal approaches a condition of local instability, due to the combined effects of the electrostatic force and the surface tension. A protruding cusp, i.e. a Taylor cone, is created. When the electric field reaches a value of about 109 V/m, the atoms at the tip spontaneously ionize and a thrust-producing ion jet is extracted by the electric field, the evaporated atoms from the tip being ionized while the electrons are rejected in the bulk of the liquid metal by tunneling.

However, the structure and manufacturing of such a capillary-type emitter is relatively complex. Furthermore, high heating currents are required by capillary-type emitters It is therefore desirable to provide an improved emitter for a liquid metal ion source or a liquid metal alloy ion source.

SUMMARY OF THE INVENTION

In view of the above, the present invention provides an emitter for a liquid metal ion source, including a wire, the wire including: a substantially curved portion and a surface, wherein at least a portion of the wire surface is tapered at the substantially curved portion to form an emitter tip. Furthermore, a method of manufacturing an emitter for a liquid metal ion source is provided, said method including the stages of providing a wire, and tapering a portion of a surface of the wire to form an emitter tip.

Further advantages, features, aspects and details of the invention are evident from the dependent claims, the description and the accompanying drawings.

According to a first aspect of the present invention an emitter for a liquid metal ion source is provided. In this context, it should be understood that the term liquid metal ion source includes liquid metal ion sources as well as liquid metal alloy ion sources. Furthermore, the emitter includes a wire having a substantially curved portion. Typically, this substantially curved portion is U-shaped or V-shaped and may be formed by bending the wire. In this context, a wire is understood as an elongated conducting member, especially made from a metal, e.g. tungsten, tantalum, titanium or nickel. Furthermore, the wire is pointed at the tip end side of the U-shaped or V-shaped substantially curved portion in that at least a part of the wire surface is chamfered. Thus, an emitter tip is formed at the tip end side of the U-shaped or V-shaped substantially curved portion.

The above described emitter has a simple structure, especially compared to capillary-type emitters, since it includes, in principle, only a suitably shaped wire. Therefore, the above described emitter forms a new type of LMIS or LMAIS emitters which may be called needleless emitters. In other words, welding of a needle tip to a filament is rendered unnecessary by the design of the above described emitter and, thus, also the problems associated therewith are overcome. Particularly, the above described emitter has an improved temperature distribution since the emitter tip is a part of the wire and, therefore, directly heated. As a result, unwanted evaporation of the source material from the reservoir can be avoided and, thus, the lifetime of the emitter is improved and the contamination of the ion beam apparatus and the specimen is reduced. Furthermore, the tip end of the emitter can be heated so that a corrosion layer, which may have formed on the wire surface, can be evaporated prior to the use of the emitter. Furthermore, an emitter having the above described properties is especially well adapted for a source material with high melting point. Due to the temperature distribution of such an emitter, heating problems with such materials having a high melting point are reduced. According to another aspect, the specific design of the emitter also allows to load the emitter with alloys having poor wetting properties. The above described emitter has a temperature distribution which increases continuously and smoothly towards the emitter tip. Due to this temperature distribution the emitter can be loaded even with alloys having poor wetting properties, e.g. In—Ga, Pb—Sn, Er—FeNiCr, Pr—Si.

According to another embodiment, the pointed or tapered section at the tip end side of the wire forms an asymmetric cone. The opening or cone angle is typically in the range from 50° to 1300 degrees. Even more typically, cone angles of 90° to 110° degrees are used wherein a cone angle of 98° degrees corresponds to the theoretical value of the Taylor cone. If cone angles in the above described range are selected for the emitter tip, the formation of a Taylor cone is assisted and facilitated.

According to a further embodiment of the present invention, the width of the wire within the pointed section is smaller than the width of the wire outside the pointed section. Thus, the resistance of the wire is higher in the pointed portion than in the rest of the wire. As a result, the wire will become hotter in the tapered portion and, thus, it is ensured that the pointed portion of the wire, i.e. the emitter tip, is the hottest part of the emitter. This improves further the lifetime of the emitter and reduces further the contamination by evaporated source material from the reservoir.

According to still another embodiment, microchannels are formed on the wire surface at least in a portion of the pointed section. Typically, these microchannels extend towards the tip end side of the emitter tip, e.g. in a winding, meandering or twisted manner. This improves the stability of the ion beam since the microchannels guide the source material, i.e. liquid metal or liquid metal alloy, from the reservoir towards the tip end of the emitter. During operation, the liquid metal or liquid metal alloy flows through the microchannels from the reservoir into the Taylor cone formed at the tip end of the emitter.

According to an even further embodiment of the present invention, the emitter has a reservoir for holding a source material, i.e. liquid metal or a liquid metal alloy. Typically, the reservoir is formed between the limbs of the U-shaped or V-shaped substantially curved portion.

According to even another embodiment, the angle $\xi$ between the limbs of the wire is in the range from $1° \leq \xi \leq 25°$ degrees. Selecting angle $\xi$ within this range facilitates wetting and loading of the reservoir portion 130 with source material 135. Furthermore, the limbs can be formed essentially identical with respect to each other and symmetrically positioned with respect to the emitter tip. Especially, the limbs may have the same length, thickness and outer shape. If the limbs are essentially identical, no lateral drift of the emitter tip due to thermal expansion of the limb portions occurs since the thermal expansion of one limb portion is counterbalanced by the thermal expansion of the opposite limb portion. Thus, the thermal expansion of the limb portions will only cause the emitter tip to move along the optical axis.

According to a further aspect of the present invention, a liquid metal ion source is provided. The liquid metal ion source has an emitter including a wire, the wire including a substantially curved portion and a surface, wherein at least a portion of the wire surface is tapered at the substantially curved portion to form an emitter tip, wherein a reservoir portion of the emitter comprises a liquid metal; and an extraction electrode for extracting ions from the emitter.

According to another aspect of the present invention, a method for manufacturing an emitter for a liquid metal ion source or a liquid metal alloy ion source is provided. The method includes the steps of providing a wire and chamfering a section of the wire within the substantially curved section. Thus, an emitter tip is formed at the tip end of the substantially curved section of the wire. Typically, the wire is chamfered by molding, grinding, or etching the wire surface. However, also other suitable methods can be used for producing a tapered portion at the tip end side of the substantially curved section.

According to even a further aspect of the present invention, a method for producing an ion beam is provided. This method includes the stages of providing, in a charged particle beam apparatus, a liquid metal ion source having an emitter, the emitter including: a wire, the wire including: a substantially curved portion and a surface; wherein at least a portion of the wire surface is tapered at the substantially curved portion to form an emitter tip, wherein a reservoir portion of the emitter comprises a liquid metal, and an extraction electrode for extracting ions from the emitter, applying a current to said wire, and applying a voltage between said liquid metal and said extraction electrode to extract ions from said liquid metal to generate an ion beam.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE DRAWINGS

Reference will now be made in detail to the various embodiments of the invention, one or more examples of which are illustrated in the figures. Each example is provided by way of explanation of the invention, and is not meant as a limitation of the invention. For example, features illustrated or described as part of one embodiment can be used on or in conjunction with other embodiments to yield yet a further embodiment. It is intended that the present invention includes such modifications and variations.

Figure 1:
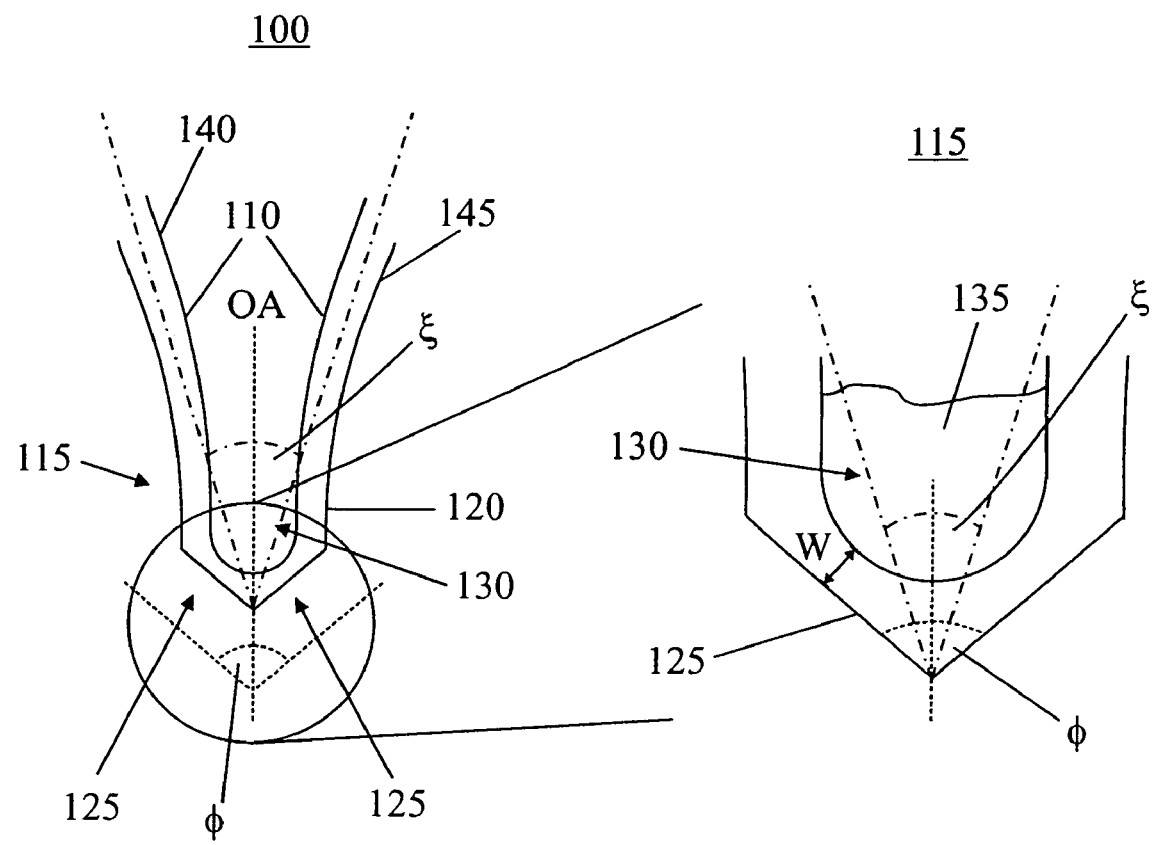
FIG. 1 shows an emitter according to an embodiment of the present invention.

The left-hand side of FIG. 1 shows an emitter 100 according to an embodiment of the present invention. The emitter 100 includes a metal wire 110 extending in a substantially curved manner so that wire 110 has an essentially U-shaped or V-shaped portion 115. Typically, wire 110 is made of tungsten, tantalum, titanium or nickel. The wire 110 is tapered at the V-shaped portion 115 to form a tapered portion 125. Typically, the tapered portion 125 is formed at the outer surface 120 of wire 110, e.g. by molding, grinding, etching, or micromachining. In addition to V-shaped portion 115, wire 110 includes also filament portions 140, 145 which can be mounted to supports (not shown). Typically, these supports also serve as electrical terminals for the wire 110 so that an electric current can be applied to the emitter 100. A reservoir portion 130 for holding an amount of a source material, i.e. a liquid metal or liquid metal alloy, is formed between the left limb 140 and the right limb 145 of the V-shaped portion.

An enlarged view of the V-shaped portion 115 is shown on the right hand side of FIG. 1. Therein, a loaded condition of the emitter is shown where source material 135 is disposed in the reservoir portion 130. Typically, the reservoir portion has a volume of 5 mm$^3$ or smaller, e.g. between 1 mm$^3$ and 5 mm$^3$. Therefore, the reservoir portion is adapted to hold a comparable amount of source material 135, i.e. up to 5 mm$^3$. Furthermore, the cone angle φ is in the range from $50°\leq\phi\leq130°$ degrees, and typically in the range from $90°\leq\phi\leq110°$ degrees. In the particular embodiment shown in FIG. 1 the cone angle φ is equal to 98° degrees since 98° degrees is the theoretical value of the Taylor cone. Thus, the formation of the Taylor cone by the liquid metal or liquid metal alloy during operation of the emitter is facilitated. A further angle ξ is shown in FIG. 1. This angle ξ is defined by the angle between the filament portions 140, 145. It should be understood that angle ξ is an approximation or average value since the filament portions 140, 145 may have some curvature. Furthermore, it should be understood that angle ξ is only defined in a region relatively near to the emitter tip, i.e. tapered portion 125, since the filament portions 140, 145 may be laterally bent for mounting filament portions 140, 145 to respective supports (not shown). Typically, the angle ξ is in the range from $1°\leq\xi\leq25°$ degrees. Selecting angle ξ within this range facilitates wetting and loading of the reservoir portion 130 with source material 135.

A further feature apparent from the right-hand side of FIG. 1 is that the width W of the wire is smaller within tapered portion 125 than in the portion of the wire outside tapered portion 125. Due to this reduced cross section of the wire within tapered portion 125, the electrical resistance is higher within tapered portion 125 than in the rest of wire 110. When an electric current is applied to wire 110, the tapered portion 125 and, thus, the emitter tip will therefore heat up more than the rest of the wire. As a result, the emitter tip becomes the hottest part of wire 110 and, thus, an almost ideal temperature distribution of the emitter is achieved. Due to the improved temperature distribution of the emitter, evaporation of source material from the reservoir is minimized so that the lifetime of the emitter is enhanced and the contamination of the ion beam apparatus and the specimen by evaporated source material is reduced.

Figure 2:
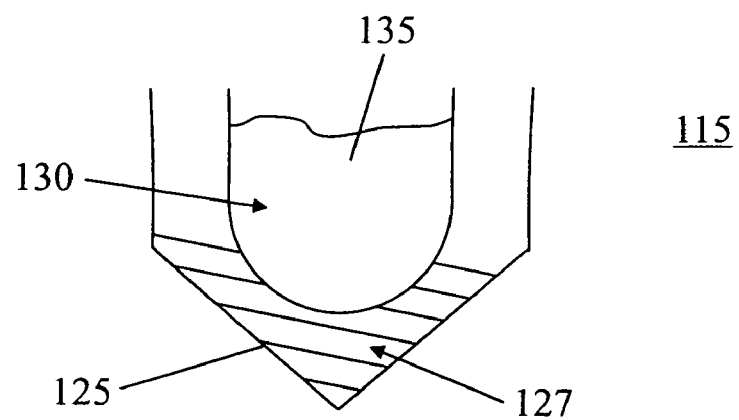
FIG. 2 shows an enlarged view of an emitter tip according to an embodiment of the present invention.

FIG. 2 shows an enlarged view of an emitter tip according to a further embodiment of the present invention. Therein, microchannels 127 are provided on the surface of wire 110 between reservoir portion 130 and the tip end side of tapered portion 125. Microchannels 127 wind around the tapered portion 125 from the reservoir portion 130 towards the tip end side of the emitter. Microchannels 127 facilitate flowing of liquid metal or liquid metal alloy 135 towards the Taylor cone formed at the tip end side during operation of the emitter. Thus, a steady flow of source material into the Taylor cone is provided and the stability of the ion beam is improved.

Figure 3:
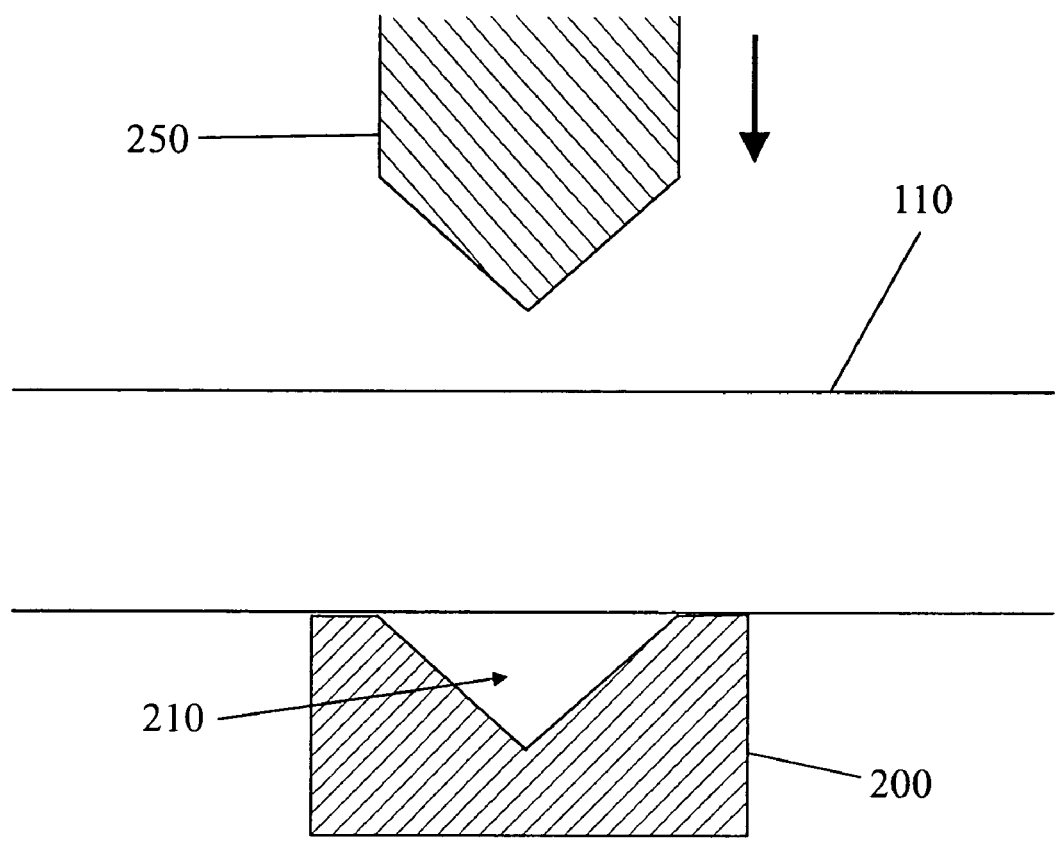
FIG. 3 shows a step of a manufacturing method of an emitter according to an embodiment of the present invention.

Next, the manufacturing of such an emitter is described with reference to FIG. 3. FIG. 3 shows a cross-sectional view of a tool for forming the tapered portion 125. The tool includes a mold 200 having a recess 210 formed in the inverse shape of the desired emitter tip. Furthermore, the tool includes a die 250 which is adapted to fit into the recess 210. The tapered portion 125 is formed by providing a wire 110 on mold 200. Wire 110 is heated, e.g. by applying a current to wire 110, so that the wire material becomes soft and moldable. Then, die 250 is pressed down onto wire 110 and forces the moldable wire material into recess 210. Thus, the wire material assumes the shape of recess 210 and a tapered portion 125 is formed on the wire surface. Furthermore, die 250 may be pressed down to an extent that wire material is thrusted aside from recess 210. As a result, a thus produced tapered portion 125 has a smaller width than the rest of wire 110.

Figure 4:
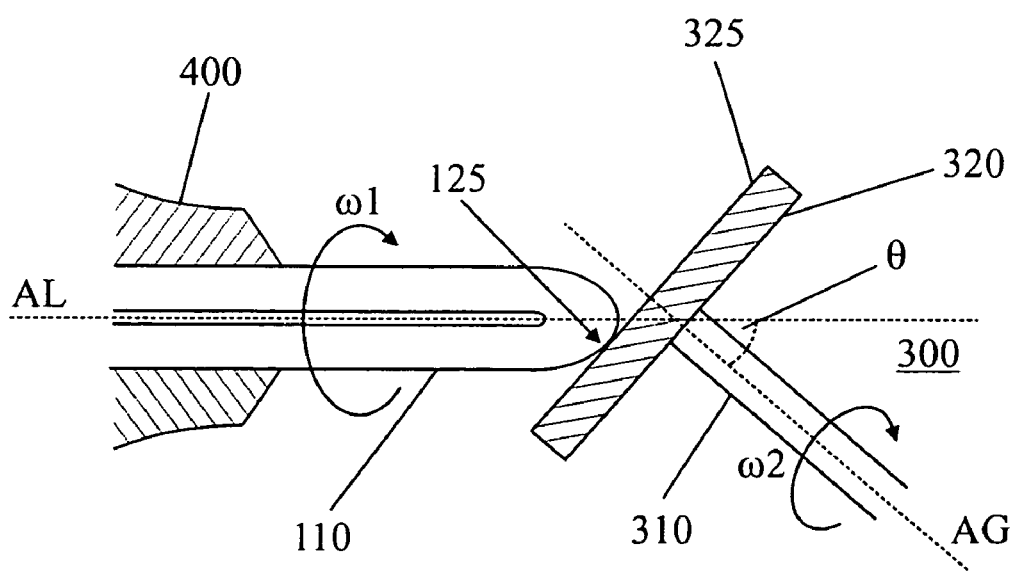
FIG. 4 shows a step of another manufacturing method of an emitter according to an embodiment of the present invention.

A further manufacturing method of an emitter according to the present invention is now described with reference to FIG. 4. Therein, a wire 110 is bent so that it is essentially U-shaped or V-shaped. The wire 110 is clamped into the chuck 400 of a lathe. Lathe chuck 400 has a rotational axis AL and wire 110 is trued along this axis. Therefore, wire 110 does not bend laterally, i.e. normal to rotational axis AL, when it is rotated with a rotational speed ω1 about axis AL. Furthermore, a grinder 300 is provided to grind the U-shaped or V-shaped portion of wire 110. An abrasive wheel 320 is mounted to a shaft 310 of grinder 300. Shaft 310 and abrasive wheel 320 can be rotated around an axis AG with a rotational speed ω2.

To produce a tapered portion 125 at the tip end of wire 110, lathe chuck 400, wire 110, and abrasive wheel 320 are rotated with rotational speeds ω1 and ω2, respectively. Then, the surface 325 of abrasive wheel 320 is brought into contact with the outer surface of wire 110 in a portion 125 to be tapered. Surface material of wire 110 is removed by grinding so that the outer surface of wire 110 is tapered at the U-shaped or V-shaped portion. Thus, the tip end of wire 110 is cone-shaped when viewed along the rotational axis AL. However, the cone is asymmetric due to the geometry of the bent wire. As is apparent from FIG. 4, the opening or cone angle φ depends on the angle θ between the rotational axis AL of the wire and the rotational axis AG of the grinder. The relation is given by $$\theta = 90° - \phi/2.$$

Typically, cone angles in the range of $50°\leq\phi\leq130°$ degrees are used so that the angle θ will be typically in the range 25° to 55° degrees. The cone-shape of the emitter tip facilitates the formation of a Taylor cone at the emitter tip and also facilitates the flow of source material from the reservoir portion to the Taylor cone. Since the theoretical value of the cone angle of the Taylor cone is 98° degrees, very typical cone angles of the emitter tip are in the range from 90°≦φ≦110° degrees so that the angle θ will be typically in the range 35° to 45° degrees. Of course, a cone angle of 98° degrees, i.e. the theoretical value of the Taylor cone, may be used and will particularly facilitate the formation of the Taylor cone at the emitter tip. Accordingly, the angle θ will then be 41° degrees (41°=90°−49°). By means of the above described method, LMIS and LMAIS emitters with various opening angles can be produced in a simple manner. Particularly, the assembly of parts and welding processes are rendered unnecessary by the above described method.

According to a third method for manufacturing an emitter according to the present invention the tapered portion 125 at the emitter tip is formed by etching the wire material. For example, if tungsten is used as a wire material, NaOH can be used to etch the tungsten wire.

It should also be understood that any combination of the above described methods can be used to manufacture the emitter according to the present invention. For example, an emitter may be preprocessed by the molding method and finished by grinding. Alternatively, the emitter may be preprocessed by etching and finished by grinding.

Figure 5:
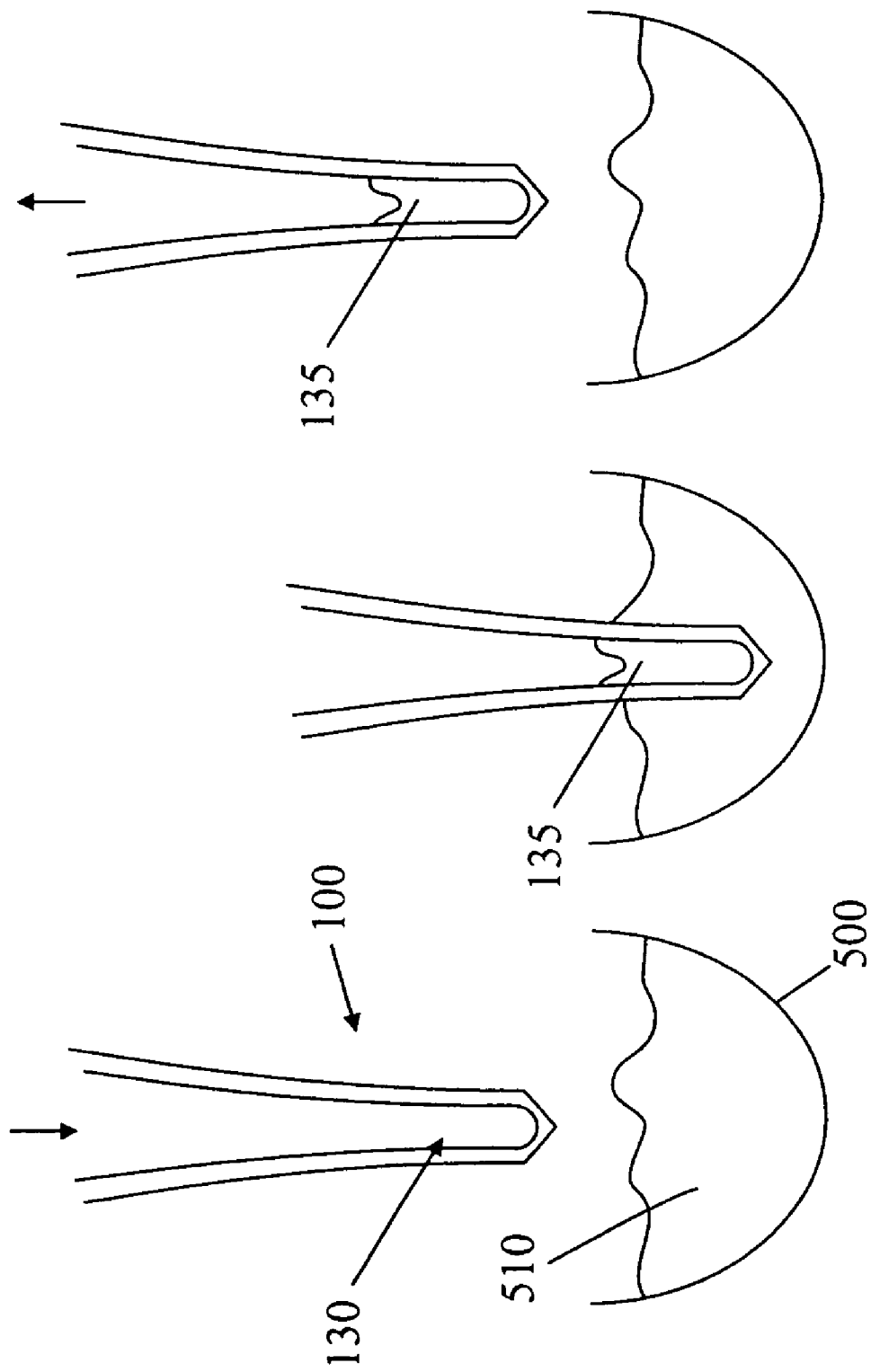
FIGS. 5A to 5C show steps of a method of loading an emitter according to an embodiment of the present invention.

FIGS. 5A to 5C show steps of a method of loading an emitter according to an embodiment of the present invention. In FIG. 5A, an emitter 100 according to an embodiment of the present invention is provided. A current is applied to emitter 100 to heat the emitter to a suitable temperature. Furthermore, a heated melting crucible 500 holding the source material 410 in a liquid state is provided. Source material 510 is a liquid metal or a liquid metal alloy and the exact temperature of the melt depends on the source material. As shown in FIG. 5B, the tip end of emitter 100 is now immersed in the liquid source material 510. Thereby, also reservoir portion 130 may be immersed. Due to the capillary forces, emitter 100 is loaded with source material 510, i.e. the V-shaped portion of wire 110 is wetted with source material and a reservoir 135 of source material is formed in the reservoir portion between the two limbs of wire 110. Since the wetting properties depend on the temperature of the wire 110 as well as on the temperature of the alloy, the wetting of the wire can be precisely controlled by controlling the temperature of the melt and the temperature of the wire. These temperatures can be controlled via the heating current through wire 110 and the temperature control of melting crucible 500. Especially, it can be controlled that not too much source material is loaded onto emitter 100. After emitter 100 is loaded with the source material, the emitter is retracted from melting crucible 500, see FIG. 5C. Of course, the above loading method is accomplished in vacuum, typically a high vacuum better than 5×10$^7$ Torr.

Figure 6:
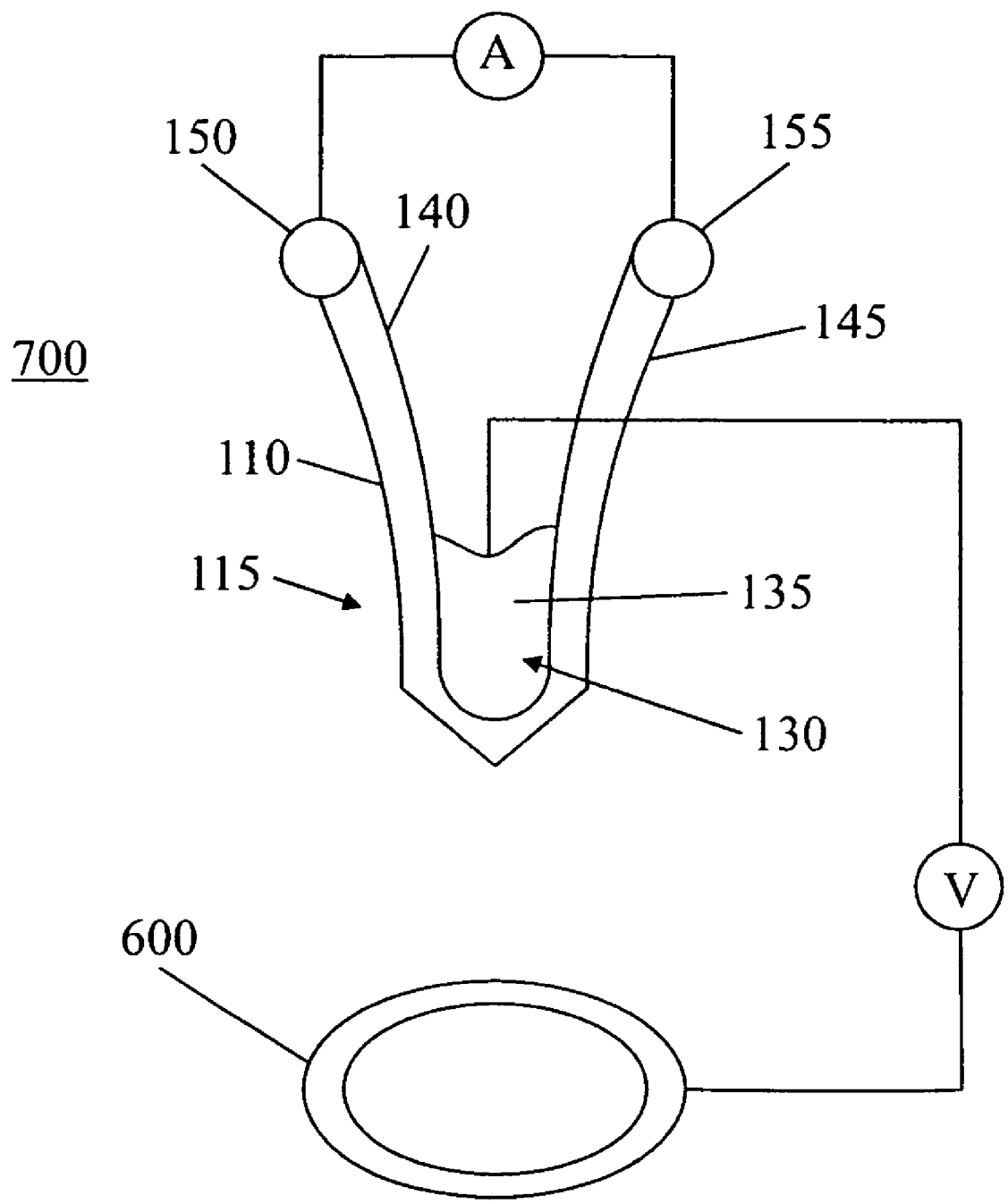
FIG. 6 is a schematic view of a liquid metal ion source using an emitter according to an embodiment of the present invention.
Figure 7:
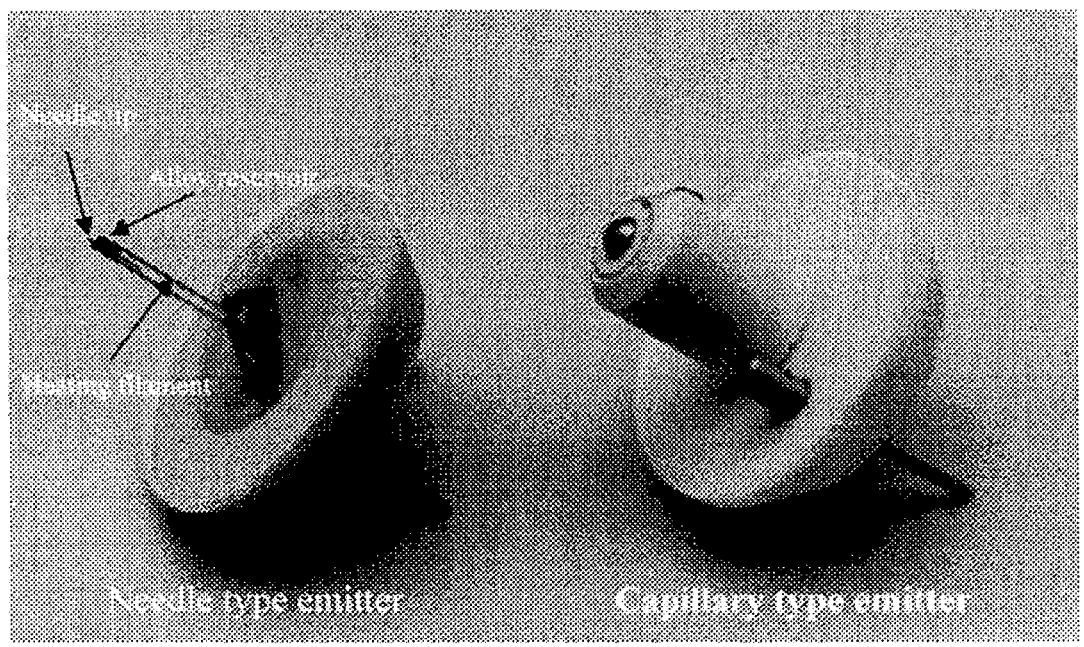
FIG. 7 is a photograph showing liquid metal ion sources according to the prior art.
Figure 8A:
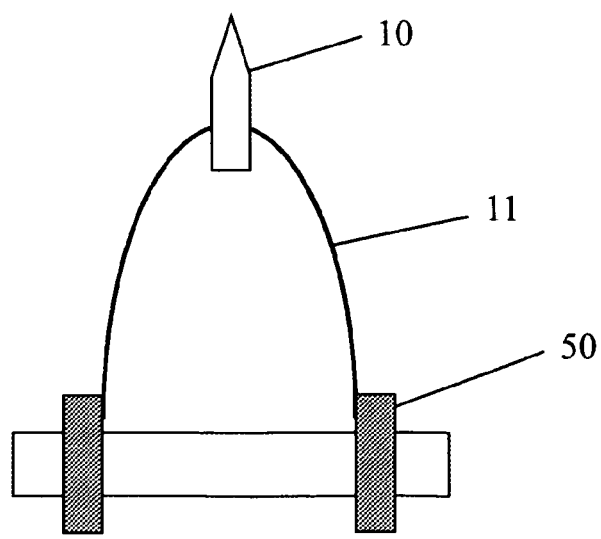
FIGS. 8A and 8B are schematic views of a needle-type liquid metal ion source according to the prior art.
Figure 8B:
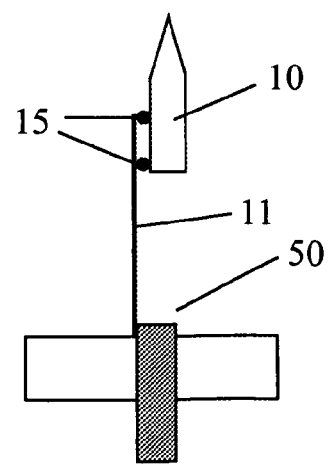
Figure 9:
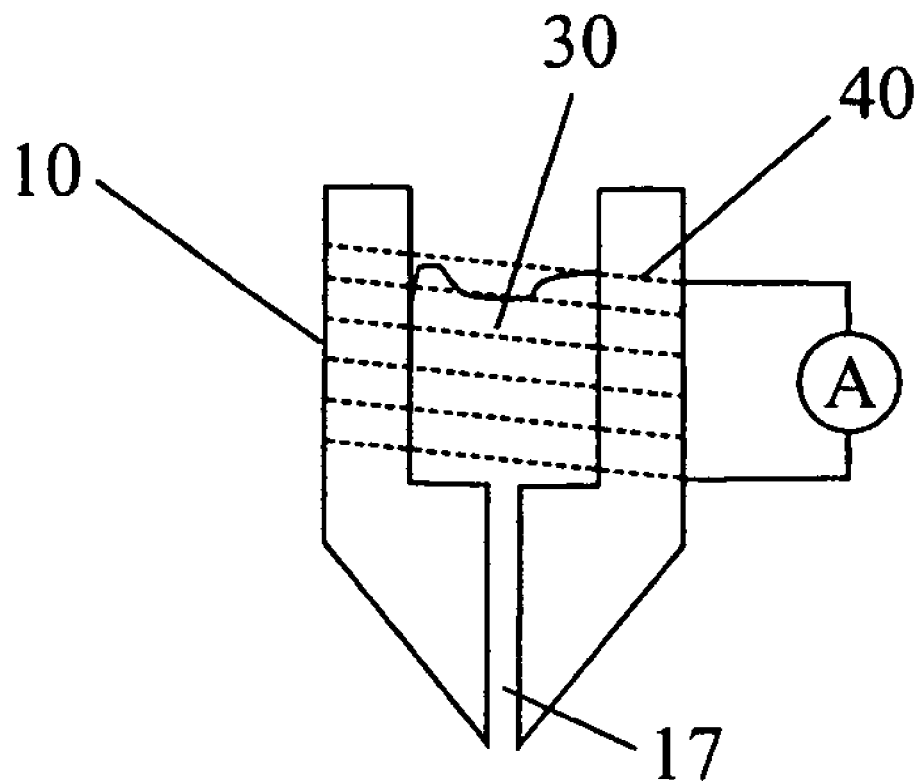
FIG. 9 is a schematic view of a capillary-type liquid metal ion source according to the prior art.

FIG. 6 is a schematic view of a liquid metal ion source 700 using an emitter 100 according to an embodiment of the present invention. The two filament portions 140, 145 of emitter 100 are formed essentially identical with respect to each other and are symmetrically positioned with respect to the emitter tip. Especially, the filament portions have the same length, thickness and outer shape. Therefore, no lateral drift of the emitter tip due to thermal expansion of the filament portions occurs since the thermal expansion of one filament portion 140 is counterbalanced by the thermal expansion of the opposite filament portion 145. Thus, the thermal expansion of the filament portions 140, 145 will only cause the emitter tip to move up or down along the optical axis. The two filament portions 140, 145 of wire 110 are mounted to supports 150, 155, respectively. Supports 150, 155 also provide electric terminals so that a current can be applied to wire 110. Thus, wire 110 can be resistively heated. Furthermore, emitter 100 is loaded with source material 135 contained in reservoir portion 130 between filament portions 140, 145. Furthermore, an extraction electrode 600 is provided, wherein a voltage can be applied between extraction electrode 600 and source material 135. Of course, this is only a formal illustration since the voltage will be typically applied between the extraction electrode and the supports 150. Due to the applied voltage, source material 135 forms a Taylor cone at the emitter tip.

To extract ions of the source material 135 from emitter 100, a current is applied to wire 110 via supports 150, 155. Wire 110 heats up, wherein the emitter tip becomes the hottest part of wire 110 due to its reduced cross section. Source material 135 flows from the reservoir portion towards the emitter tip. The evaporated atoms of the source material are ionized at the tip end of the Taylor cone and are accelerated towards the specimen (not shown) by extraction electrode 600. Thus, an ion beam is formed by the LMIS or LMAIS 700 shown in FIG. 6. Of course, the liquid metal ion source 700 described above can be used in a charged particle beam apparatus to produce an ion beam, e.g. for FIB operation.

According to another aspect, the emitter is well suited for Si-containing alloys which are of special interest in semiconductor manufacturing processes. For example, liquid metal alloy ion source using the binary alloy PrSi is described in European patent application No. 04017894.9 which is hereby incorporated by reference. It is described in European patent application No. 04017894.9 that the binary alloy PrSi is advantageous because only Pr and Si ions as well as a small amount of cluster and molecular ions are generated by such an ion source. An emitter according to an embodiment of the present invention can be advantageously used for a PrSi ion source. To this end, the binary alloy PrSi is provided as a source material in the reservoir portion 130 of a tantalum emitter or a nickel emitter. Although described with respect to PrSi, it should be understood that an emitter according to the present invention can also be advantageously used for difficult materials like InGa, PbSn, ErFeNiCr. Of course, the present emitter is also perfectly suited for materials normally used for LMIS like Ga or the like.

Having thus described the invention in detail, it should be apparent for a person skilled in the art that various modifications can be made in the present invention without departing from the spirit and scope of the following claims.

The invention claimed is:

1. An emitter for a liquid metal ion source, comprising a single piece of wire, the wire comprising:
    a substantially curved portion formed by a bend in the wire;
    a wire surface extending circumferentially around the wire;
    filament portions of the wire on the sides of the substantially curved portion for connecting the wire with support means, wherein at least a portion of the wire surface is tapered at the substantially curved portion to form an emitter tip; and
    a reservoir portion formed between the filament portions and adapted for holding a liquid metal source material.

2. The emitter according to claim 1, wherein the tapered portion of the wire surface is an outer surface of the wire.

3. The emitter according to claim 1, wherein the tapered portion forms a cone when viewed along an optical axis (OA) of the emitter.

4. The emitter according to claim 3, wherein a cone angle φ is in the range from 50°≦φ≦130° degrees.

5. The emitter according to claim 4, wherein the cone angle φ is equal to 98° degrees.

6. The emitter according to claim 1, wherein a diameter (W) of the wire in the tapered portion is smaller than a diameter of the wire outside the tapered portion.

7. The emitter according to claim 1, wherein microchannels are provided at the wire surface at least in a portion of the tapered portion.

8. The emitter according to claim 1, wherein the filament portions are formed essentially identical with respect to each other and are symmetrically positioned with respect to the emitter tip.

9. The emitter according to claim 1, wherein the angle ξ between the filament portions is in the range from $1° \leq \xi \leq 25°$ degrees.

10. The emitter according to claim 1, wherein the wire is a metal wire or a wire-shaped conductive material.

11. The emitter according to claim 10, wherein the wire is made of tungsten, tantalum, titanium or nickel.

12. The emitter according to claim 1, wherein the emitter is a liquid metal alloy ion source for an alloy comprising Si as a component.

13. The emitter according to claim 12, wherein the emitter is a liquid metal alloy ion source for the binary alloy PrSi.

14. A liquid metal ion source comprising an emitter, the emitter comprising:
a single piece of wire, the wire having a substantially curved portion formed by a bend in the wire, a wire surface extending circumferentially around the wire, and filament portions of the wire on the sides of the substantially curved portion for connecting the wire with a support means, wherein at least a portion of the wire surface is tapered at the substantially curved portion to form an emitter tip; and
a reservoir portion of the emitter, wherein the reservoir portion is formed between the filament portions and comprises a liquid metal, and an extraction electrode for extracting ions from the emitter.

15. The liquid metal ion source according to claim 14, wherein the tapered portion forms a cone when viewed along an optical axis (OA) of the emitter.

16. A charged particle beam apparatus, comprising a liquid metal ion source according to claim 14.

17. A method of manufacturing an emitter for a liquid metal ion source, comprising:
(a) providing a single piece of wire with a substantially curved portion formed by a bend in the wire, a wire surface, extending circumferentially around the wire, filament portions of the wire on the sides of the substantially curved portion for connecting the wire with a support means, and a reservoir portion formed between the filament portions and adapted for holding a liquid metal source material; and
(b) tapering the substantially curved portion of the surface of the wire to form an emitter tip.

18. The method according to claim 17, wherein the tapering comprises molding.

19. The method according to claim 17, wherein the tapering comprises grinding.

20. The method according to claim 17, wherein the tapering comprises etching.

21. The method according to claim 17, wherein the tapering comprises micromachining.

22. A method for producing an ion beam, comprising:
(a) providing, in a charged particle beam apparatus, a liquid metal ion source comprising an emitter, the emitter comprising:
a single piece of wire, the wire having a substantially curved portion formed by a bend in the wire, a wire surface extending circumferentially around the wire, and filament portions of the wire on the sides of the substantially curved portion, wherein at least a portion of the wire surface is tapered at the substantially curved portion to form an emitter tip, and wherein a reservoir portion of the emitter comprises a liquid metal; and
an extraction electrode for extracting ions from the emitter;
(b) applying a current to said wire; and
(c) applying a voltage between said liquid metal and said extraction electrode to extract ions from said liquid metal to generate an ion beam.

23. A liquid metal ion source, produced by the method of:
(a) providing a single piece of wire with a substantially curved portion formed by a bend in the wire, a wire surface extending circumferentially around the wire, and filament portions of the wire on the sides of the substantially curved portion for connecting the wire with a support means and a reservoir portion for connecting the wire with a support means, and reservoir portion formed between the filament portions and adapted for holding a liquid metal source material; and
(b) tapering the substantially curved portion of the surface of the wire to form an emitter tip.

24. The liquid metal ion source according to claim 23, wherein the tapering comprises molding, grinding, etching or micromachining.

* * * * *

UNITED STATES PATENT AND TRADEMARK OFFICE
CERTIFICATE OF CORRECTION

PATENT NO. : 7,696,489 B2  Page 1 of 1
APPLICATION NO. : 11/494274
DATED : April 13, 2010
INVENTOR(S) : Pilz et al.

It is certified that error appears in the above-identified patent and that said Letters Patent is hereby corrected as shown below:

In the Summary of the Invention:

Column 3, Line 30, please delete "1300" and insert --130-- therefor;

In the Claims:

Column 9, Claim 17, Line 48, please delete "," after surface;

Column 10, Claim 23, Lines 40-42, please delete "for connecting the wire with a support means, and reservoir portion".

Signed and Sealed this

Thirteenth Day of July, 2010

David J. Kappos
*Director of the United States Patent and Trademark Office*